United States Patent [19]

Inaniwa et al.

[11] 3,948,696
[45] Apr. 6, 1976

[54] METHOD OF DIFFUSION INTO SEMICONDUCTOR WAFERS

[75] Inventors: Keizo Inaniwa; Noboru Ryugo, both of Takasaki, Japan

[73] Assignee: Hitachi, Ltd., Japan

[22] Filed: Feb. 28, 1974

[21] Appl. No.: 446,791

[30] Foreign Application Priority Data
Feb. 28, 1973 Japan.............................. 48-23208

[52] U.S. Cl. ................ 148/189; 148/186; 148/187
[51] Int. Cl.²......................................... H01L 7/44
[58] Field of Search................... 148/189, 187, 186

[56] References Cited
UNITED STATES PATENTS

| | | | |
|---|---|---|---|
| 3,374,125 | 3/1968 | Goldsmith........................... | 148/189 |
| 3,532,564 | 10/1970 | Gittler................................. | 148/188 |
| 3,726,726 | 4/1973 | Kasabov............................. | 148/189 |
| 3,755,017 | 8/1973 | Coughlin............................ | 148/189 |
| 3,804,682 | 4/1974 | Keller.................................. | 148/189 |

OTHER PUBLICATIONS

Benjamin, I.B.M. Technical Disclosure Bulletin, Vol. 15, No. 2, July 1972, pp. 414 and 415.

*Primary Examiner*—G. Ozaki
*Attorney, Agent, or Firm*—Craig & Antonelli

[57] ABSTRACT

In diffusing an impurity into semiconductor wafers within a silica tube by the use of a heating furnace, a method of diffusion involves the following steps: the semiconductor wafers are inserted into the tube from an inlet thereof, the inlet is sealed by a cap, the interior of the tube is placed under vacuum, and an atmosphere of the impurity is formed. Since, at heating, the tube is closed and no inert gas is fed thereinto, the temperature distribution within the tube is held uniform, and hence the quantities of impurity introduction into the semiconductor wafers are not varied.

11 Claims, 4 Drawing Figures

METHOD OF DIFFUSION INTO SEMICONDUCTOR WAFERS

BACKGROUND OF THE INVENTION

1. Field of the Invention

The present invention relates to a method of diffusing an impurity into a semiconductor wafer.

2. Description of the Prior Art

In diffusing an impurity into semiconductor wafers, for example, in diffusing a P-type impurity into silicon wafers by the use of boron nitride (BN), the following is a description of a known method. Wafers (partially oxidized to some extent) of boron nitride (which is a P-type impurity source) and wafers of silicon are alternately arranged on a boat. In this arrangement, the boat is inserted into a silica tube. Thereafter, the silica tube is heated from an outer periphery, to form a boron oxide atmosphere inside the silica tube. In this manner, boron oxide is deposited on the silicon wafers, and besides, the impurity oxide is diffused into them. In this case, an inert gas ($N_2$) is fed in through one end of the silica tube, so as to prevent the surfaces of the silicon wafers from being oxidized.

With this known method, however, the silica tube is in the open state during the heating and the inert gas is fed in through one end of the silica tube, so that the temperature distribution within the silica tube is not uniform in its lengthwise direction. For this reason, the quantity of impurity introduced into the silicon wafers lined up on the boat is dispersed, i.e., varied, and accordingly, surface specific resistance of the silicon wafers depends on the lined-up position of each wafer.

This point will now be described in detail. As stated above, the inert gas is caused to flow in through one end of the silica tube. Even when the inflowing inert gas reaches a uniformly heated portion within the tube, it does not yet arrive at the uniform heating temperature. Therefore, the inert gas lowers the temperature of the boron nitride and silicon wafers at the uniformly heated portion of the tube. In addition, the inert gas disturbs the flow of a boron oxide impurity gas produced from the boron nitride. Further, the other end of the silica tube is open in the foregoing boron deposition and diffusion process. Consequently, the air intrudes into the tube from the open end, oxidizes the surfaces of the silicon wafers and locally checks the deposition of impurity. Due to such various factors, the quantity of impurity introduction into the silicon wafers varies in dependence on the lined-up position of the wafers on the boat, and a variation in the surface specific resistance arises.

As a method for compensating for the drawbacks described above, the so-called ampoule diffusion procedure is contemplated in which silicon wafers and an impurity are sealed in a vacuum ampoule, the ampoule is inserted into a silica tube, and the tube is heated to directly vaporize atoms of the impurity and to diffuse them into the semiconductor wafers. With this method, however, the semiconductor surface becomes rough. In addition, it is necessary to especially fabricate the ampoule and to break it after completion of the diffusion. Thus, the method is uneconomical and is troublesome in procedure.

SUMMARY OF THE INVENTION

It is therefore the principal object of the present invention to provide a method of impurity diffusion into semiconductor wafers which diminishes a variation in the surface concentrations of the diffused layers in the case of an impurity deposition or diffusion for the silicon wafers.

Another object of the present invention is to provide a method impurity of diffusion into semiconductor wafers which eliminates the want of economy and the troublesome procedure as in the ampoule diffusion and by which the diffusion treatment can be carried out within a silica tube many times.

In order to accomplish these objects, the present invention comtemplates a process wherein a diffusion apparatus comprising a diffusion furnace composed of a furnace core tube and a heater is used, semiconductor wafers are inserted from an inlet of the furnace core tube, the inlet is sealed by a cap, the interior of the furnace core tube is placed under vacuum, an atmosphere of an impurity is formed within the tube, e.g., by heating an impurity source within the core tube or by introducing the atmosphere into the tube, and the impurity is diffused into the semiconductor wafers.

PREFERRED EMBODIMENTS OF THE INVENTION

Figure 1:
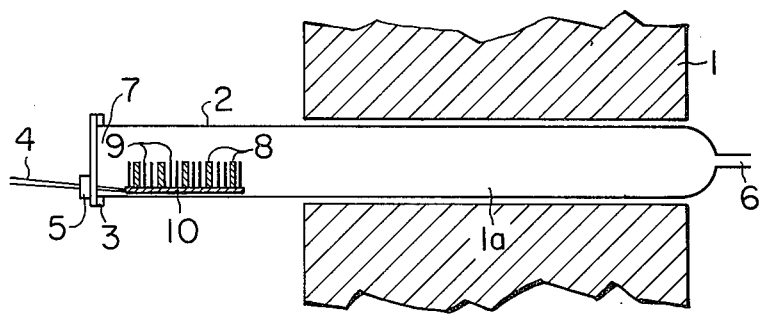
FIG. 1 is an elevational view illustrating an embodiment of the apparatus and the diffusion method of the invention for diffusing an impurity into semiconductor wafer.

FIG. 1 shows a diffusion apparatus illustrative of the type in which an embodiment of the method of impurity diffusion into semiconductor wafers is practiced according to the present invention. In the diffusion apparatus shown, a furnace core tube 2 made of silica tube is fitted in an electric furnace 1 including an electric resistance heater. At one end of the furnace core tube 2, a detachable cap 3 is fitted, e.g., the cap 3 has the structure of a cap nut that is screwed onto the tube 2. This cap is made of a metal such as aluminum or of a ceramic. At a part of the cap 3, there is provided a passage 5 for passing a drawer rod 4 therethrough. The drawer rod 4 serves to move a boat for positioning semiconductor wafers which will be described in greater detail. At the other end of the furance core tube 2, an evacuating port 6 is formed which communicates with the interior of the furnace core tube 2 and which is connected to a vacuum pump not shown. In this case, the hole or passage 5 is so constructed that the air may not enter even when the interior of the furnace core tube 2 is evacuate. For example, rod 4 may be threaded within passage 5.

With such construction, boron nitride wafers 8 and silicon wafers 9 to be diffused are arranged on the boat 10 so that the silicon wafers can oppose both faces of the former wafers. The boat 10 is placed at an open end 7 of the furnace core tube 2. Thereafter, the open end 7 is sealed by the cap 3. The interior of the furnace core tube 2 is placed under vacuum through the evacuating port 6 opposite to the open end 7 by the use of the vacuum pump not shown. With the vacuum state held, the boat 10 is moved to the central part 1a of the furnace core tube 2 by the drawer rod 4, and the deposition and diffusion of impurity are carried out by the application of heat. After the treatment, the boat 10 is pulled back towards the cap 3 of the furnace core tube 2 by the drawer rod 4, the cap 3 is detached, and the boat 10 is taken out.

With this process, the deposition is effected in the vacuum, so that the non-uniformity in temperature, as caused by the current of an inert gas differing in temperature from the furnace core tube 2, does not arise. Since only the boron oxide ($B_2O_3$) impurity gas vaporizing from the boron nitride (BN) is used, the non-uniformity in the atmosphere of the boron impurity gas in the vicinity of the silicon wafers caused by the inflow of the inert gas such as $N_2$ gas can be avoided. Consequently, unformity is achieved in the concentration of the boron impurity to be diffused into the silicon wafers, and no variation occurs in the surface specific resistance Since the air is perfectly shut out, the oxidation of the silicon wafers is prevented, and the semiconductor wafer surfaces are uniformly covered with deposition layers of boron oxide.

After the deposition treatment stated above, the boron oxide formed on the surfaces of the semiconductor wafers is etched and removed with the diffused impurity left behind. Then, diffusion is carried out in a oxidizing atmosphere again.

Figure 2:
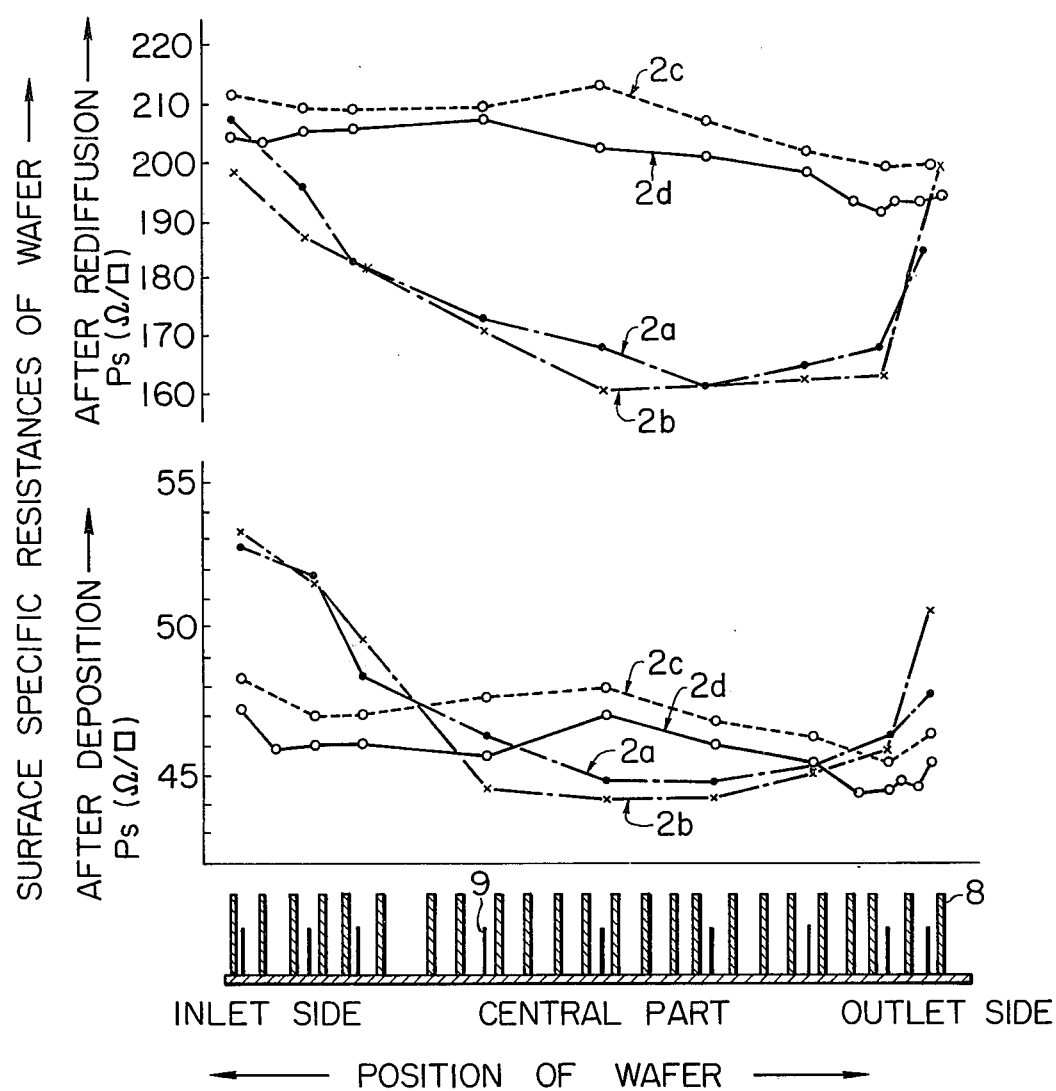
FIG. 2 is a diagram illustrating the results of comparative experiments by the method of the present invention and a prior-art method.

FIG. 2 illustrates the results when the method of the present invention and the prior-art method were experimentally studied. The abscissa represents the position of each silicon wafer arranged on the boat, while the ordinate represents the surface specific resistances of the silicon wafer after the deposition and after the rediffusion. As understood from the graph, the prior-art method, indicated at 2a and 2b, exhibits U-shaped characteristics, and the silicon wafers have great differences in the surface specific resistance between the central part of the boat and both end parts thereof. In contrast, according to the method of the present invention, the surface specific resistances of the silicon wafers becomes substantially horizontal and rectilinear as shown by curves 2c and 2d, and the resistance is not very different between the central part of the boat and the end parts thereof.

Figure 3:
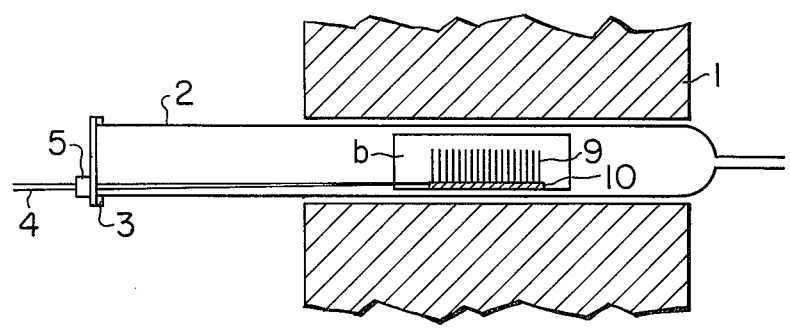
FIGS. 3 and 4 are elevational views each showing other embodiments of the present invention.

In this embodiment, the boron nitride wafers and the silicon wafers are oppositely arranged on the boat. Since, however, the diffusion length of molecules (here, $B_2O_3$) is extended in the vacuum, the boron vapor spreads sufficiently within the vacuum system, and it is therefore unnecessary to oppose the boron nitride wafers and the silicon wafers. Accordingly, boron nitride may be in any desired form and may be located at any desired position within the furnace core tube. By way of example, as shown in FIG. 3, a tunnel b of boron nitride is made by a cylinder thereof within the furnace core tube, and the boat 10 on which only the silicon wafers 9 are erected is inserted therein.

Although, in the foregoing embodiment, boron nitride is used as the impurity, the boron oxide gas may also be employed. The oxide gas may be introduced after the interior of the furnace core tube with only the silicon wafers inserted therein has been evacuated.

Figure 4:
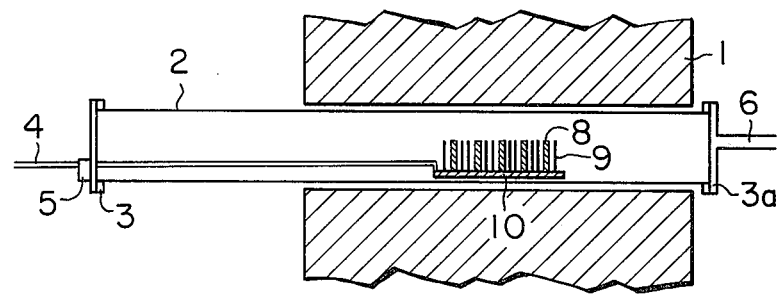

Although, in the foregoing embodiment, the boat is inserted from one end of the furnace core tube and is taken out from the same end after the deposition, it is also possible that, as illustrated in FIG. 4, that a similar cap 3a is also provided at the other end so as to take out the boat therefrom. It is a matter of course that, in this case, the evacuating port for the vacuum may be provided in the outer periphery of the furnace core tube or in either of the caps at both the ends.

Although, in the foregoing embodiments, the interior of the furnace core tube is evacuated by means of the vacuum pump, there will be the possibility that a slight amount of air will remain to oxidize the silicon wafers. In this respect, the prevention of the oxidation is increased in reliability by conducting the evacuating operation after the tube has been once filled with an inert gas such as $N_2$.

With the method of diffusion into semiconductor wafers according to the present invention as described above, the variation in the surface concentrations of the impurity diffused layers can be reduced to approximately 1/5. Since the impurity concentrations at the central part and both the end parts of the boat have substantially no difference, large quantities of semiconductor wafers can be received by increasing the length of the boat. The number of the semiconductor wafers to be treated at one time of deposition can therefore be increased to be 2 – 3 times as large as that treated in the prior art.

It will be understood, that the pressure of the tube may be reduced to not more than 100 torr and that furnace temperatures on the order of from 850° to 1150°C. may be employed to effect diffusion of the impurity. Also, other impurities such as phosphorus and antimony may be deposited by this method. For example, phosphorus nitride ($P_3N_5$) and antimony oxide ($Sb_2O_3$) may be used as impurity sources. The conditions and results of such impurity deposition under vacuum are further described in U.S. pat. application Ser. No. 440,358 filed on Feb. 7, 1974.

In general, the furnace is heated to the required temperatures for a predetermined time of from 10 to about 120 minutes to promote diffusion of the impurity into the silicon wafers. Also, the silicon wafers are usually from about 30 to 100 mm in diameter and are spaced from about 1 to 1.5 mm from each other on the supporting jig, i.e., boat 10. Also, as previously mentioned, the pressure in the furnace core tube is reduced to not more than 100 Torr. A preferred reduced pressure range for an embodiment of the type illustrated in FIG. 3 is from 0.1 to 1 Torr.

While the novel embodiments of the invention have been described, it will be understood that various omissions, modifications and changes in these embodiments may be made by one skilled in the art without departing from the spirit and scope of the invention.

What is claimed:

1. A method for diffusing an impurity into a semiconductor wafer comprising preparing a diffusion furnace composed of a furnace core tube having an inlet with a releasable closure means and a heater, inserting said semiconductor wafer into said furnace core tube through said inlet, closing said inlet by said closure means, creating a vacuum in the interior of said furnace core tube, forming an atmosphere of an impurity within said tube, depositing the impurity on a surface portion of said semiconductor wafer, and diffusing the impurity into said surface portion of said semiconductor wafer in an oxidizing atmosphere.

2. The method of claim 1, wherein the impurity includes boron, phosphorus and antimony, and said semiconductor wafers are made of silicon.

3. The method of claim 1, wherein the atmosphere of an impurity is formed within said tube by initially placing an impurity source with said tube before making said vacuum and then heating said tube to an elevated temperature sufficient to vaporize said impurity source.

4. The method of claim 1, wherein the vacuum is made in said tube by attaching a vacuum pump to an opening in said tube and by operating said pump.

5. The method of claim 1, wherein the atmosphere of an impurity is formed within said tube by passing vapors of said impurity into said furnace.

6. The method of claim 1, wherein the atmosphere in said furnace core tube is replaced with an inert gas prior to creation of a vacuum in said furnace core tube.

7. The method of claim 1, wherein the pressure in the furnace core tube during deposition of the impurity on said surface portion is not more than 100 Torr.

8. The method of claim 7, wherein the atmosphere in said furnace core tube is replaced with an inert gas prior to creation of a vacuum in said furnace core tube.

9. The method of claim 7, wherein the furnace temperature during deposition of said impurity on said semiconductor wafer is from 850° to 1150°C.

10. The method of claim 9, wherein the atmosphere in said furnace core tube is replaced with an inert gas prior to creation of a vacuum in said furnace core tube.

11. The method of claim 9, wherein said impurity is boron nitride.

* * * * *